US012628321B2

(12) United States Patent
Miller et al.

(10) Patent No.: US 12,628,321 B2
(45) Date of Patent: May 12, 2026

(54) ELECTROMAGNETIC ABSORBING COMPOSITES

(71) Applicant: 3M INNOVATIVE PROPERTIES COMPANY, St. Paul, MN (US)

(72) Inventors: Adam D. Miller, Vadnais Heights, MN (US); Dipankar Ghosh, Oakdale, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 181 days.

(21) Appl. No.: 18/256,979

(22) PCT Filed: Dec. 16, 2021

(86) PCT No.: PCT/IB2021/061849
§ 371 (c)(1),
(2) Date: Jun. 12, 2023

(87) PCT Pub. No.: WO2022/144670
PCT Pub. Date: Jul. 7, 2022

(65) Prior Publication Data
US 2024/0098950 A1       Mar. 21, 2024

Related U.S. Application Data

(60) Provisional application No. 63/199,448, filed on Dec. 29, 2020.

(51) Int. Cl.
*H05K 9/00*            (2006.01)
(52) U.S. Cl.
CPC ........... *H05K 9/003* (2013.01); *H05K 9/0083* (2013.01); *H05K 9/0084* (2013.01)

(58) Field of Classification Search
CPC ..................................................... H05K 9/003
See application file for complete search history.

(56) References Cited

U.S. PATENT DOCUMENTS 3,404,034 A     10/1968   Maurer et al.
3,549,412 A     12/1970   Frey, Jr. et al.
(Continued)

FOREIGN PATENT DOCUMENTS

CN        1772707 A      5/2006
EP        0479438 B1     4/1997
(Continued)

OTHER PUBLICATIONS

Communication pursuant to Article 94(3) EPC for EP Application No. 21834915.7, mailed on Mar. 6, 2025, 8 pages.
(Continued)

*Primary Examiner* — William D Young
(74) *Attorney, Agent, or Firm* — Phillip P. Soo; Lynn R. Hunsberger

(57)                ABSTRACT

A composite comprising a polymeric matrix and EM absorbers dispersed within the polymeric matrix. Each EM absorber comprises a ceramic particle having a surface, and a magnetic coating on at least a portion of the surface of the ceramic particle. The EM absorbers function as dielectric and magnetic absorbers in the 1-100 GHz frequency range. The composite can be used as an electromagnetic shielding article to mitigate electromagnetic interference in, for example, high speed, high frequency (HSHF) consumer electronics.

18 Claims, 6 Drawing Sheets

(56)　　　　　　References Cited

U.S. PATENT DOCUMENTS

| | | | |
|---|---|---|---|
| 4,264,648 | A | 4/1981 | Ziolo et al. |
| 5,389,434 | A * | 2/1995 | Chamberlain ........ H01Q 17/004 |
| | | | 427/205 |
| 5,673,148 | A | 9/1997 | Morris et al. |
| 6,310,141 | B1 | 10/2001 | Chen et al. |
| 8,698,394 | B2 | 4/2014 | Mccutcheon et al. |
| 8,906,504 | B2 | 12/2014 | Kniess et al. |
| 9,704,613 | B2 | 7/2017 | Ghosh et al. |
| 10,340,054 | B2 | 7/2019 | Ghosh et al. |
| 11,784,416 | B2 * | 10/2023 | Holdstock .......... H01Q 15/0013 |
| | | | 342/4 |
| 2010/0181522 | A1 * | 7/2010 | Kim ........................ C22C 38/10 |
| | | | 252/62.51 R |
| 2019/0289759 | A1 | 9/2019 | West et al. |
| 2020/0053920 | A1 * | 2/2020 | Ghosh ...................... C08K 3/04 |
| 2023/0193101 | A1 | 6/2023 | Manuilov et al. |

FOREIGN PATENT DOCUMENTS

| | | | |
|---|---|---|---|
| EP | 2214180 | A1 | 8/2010 |
| GB | 396231 | A | 8/1933 |
| JP | 2019057561 | A | 4/2019 |
| WO | 1996041354 | A1 | 12/1996 |
| WO | 2018080703 | A1 | 5/2018 |
| WO | 2018080755 | A1 | 5/2018 |
| WO | 2018081394 | A1 | 5/2018 |

OTHER PUBLICATIONS

Written Opinion of the International Searching Authority for PCT International Application No. PCT/IB2021/061849, mailed on Mar. 16, 2022, 8 pages.

Ghosh, "Structural and High GHz Frequency EMI (Electromagnetic Interference) Properties of Carbonyl Iron and Boron Nitride Hybrid Composites", Materials Research Express, 2019, vol. 6, No. 10, pp. 106305.

International Search report for PCT International Application No. PCT/IB2021/061849, mailed on Mar. 16, 2022, 4 pages.

* cited by examiner

ELECTROMAGNETIC ABSORBING COMPOSITES

CROSS REFERENCE TO RELATED APPLICATIONS

This application is a national stage filing under 35 U.S.C. 371 of PCT/IB2021/061849, filed Dec. 16, 2021, which claims the benefit of U.S. Provisional Patent Application No. 63/199,448, filed Dec. 29, 2020, the disclosure of which is incorporated by reference in its/their entirety herein.

FIELD OF INVENTION

The present invention relates to electromagnetic absorbing composites that may be used to shield electronic devices or radiation sources, articles containing the composites, and methods of making the composites.

BACKGROUND

Electromagnetic interference (EMI) is a common issue encountered in electronic systems, such as electronic communications systems. Outside electromagnetic radiation is well known to induce undesirable currents in electronic components, thereby disrupting their normal operations. In order to protect against such effects, it is common to completely shield an electronic device or component via highly conductive enclosures, such as coatings, gaskets, adhesives sealants, wire sleeves, metal meshes or filters, and the like. These types of shields operate by reflecting the unwanted electromagnetic fields away from the sensitive component. Another form of protection is offered by electromagnetic absorbing materials. These are typically not highly conductive and operate by absorbing the unwanted electromagnetic energy and converting it to heat. Absorbers are widely used in radar and stealth applications. They are also commonly found inside of electronic devices where they are used to control electromagnetic emissions from the device. Electromagnetic absorbers can be classified as magnetic absorbers if they interact principally with the magnetic field component of an electromagnetic wave or as dielectric absorbers if they interact principally with the electric field component of the electromagnetic wave. Electromagnetic absorbers are especially beneficial in a high frequency regime, for example, in the 1-40 GHz or 1-100 GHz frequency range and harmonics associated with such base frequencies.

There remains a need for flexible and versatile electromagnetic absorbing materials that can be used to mitigate electromagnetic interference. These materials should be lightweight, readily handled in industrial processes, and have loss characteristics that are appropriate to the frequency range of interest for a particular application.

SUMMARY

The present disclosure provides a composite comprising a polymeric matrix and electromagnetic (EM) absorbers dispersed therein. The EM absorbers comprise magnetically coated ceramic particles. The magnetic coating adds magnetic loss (i.e. increases the value of the imaginary part of the magnetic permeability) to a nonmagnetic ceramic particle. The magnetic coating increases the permeability of the EM absorber so that it more closely matches the permittivity of the ceramic particle, thus reducing the electromagnetic reflection and enhancing the electromagnetic absorption of the EM absorber and the resultant composite. Composites of the present disclosure are capable of mitigating electromagnetic interference in the 1-100 GHz frequency range, more particularly the 1-20 GHz frequency range.

In one embodiment, the present disclosure provides a composite comprising a polymeric matrix, and EM absorbers dispersed within the polymeric matrix, each EM absorber comprising a ceramic particle having a surface, and a magnetic coating on at least a portion of the surface of the ceramic particle, wherein the EM absorbers function as dielectric and magnetic absorbers in the 1-100 GHz frequency range.

In another embodiment, the present disclosure provides an electromagnetic interference shielding article comprising the composite.

In a further embodiment, the present disclosure provides a method of making the composite.

The following definitions shall be applied to the defined terms through the entire application, unless otherwise stated to the contrary. As used herein:

The term "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of" Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

In this application, terms such as "a," "an," and "the" are not intended to refer to only a singular entity, but include the general class of which a specific example may be used for illustration.

The term "and/or" means one or all of the listed elements or a combination of any two or more of the listed elements.

The recitations of numerical ranges by endpoints include all numbers subsumed within that range as well as the endpoints (e.g., 1 to 5 includes 1, 1.5, 2, 2.75, 3, 3.80, 4, 5, etc.).

Reference throughout this specification to "some embodiments" means that a particular feature, configuration, composition, or characteristic described in connection with the embodiment is included in at least one embodiment of the disclosure. Thus, the appearances of such phrases in various places throughout this specification are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances; however, other embodiments may also be preferred, under the same or other circumstances. Furthermore, the recitation of one or more preferred embodiments does not imply that other embodiments are not useful, and is not intended to exclude other embodiments from the scope of the disclosure.

The term "composite" refers to a material in which two or more materials coexist without chemical interaction, and one or more phases can be discrete or continuous.

The term "ceramic particle" or "ceramic particles" refers to a nonmagnetic dielectric lossy ceramic particle(s) that has a dielectric loss tangent in the range from 0.001-0.50, more particularly 0.01-0.30 over the frequency range of 1-100 GHz. The dielectric loss tangent, typically referred to as tan δ, is a frequency dependent parameter of a dielectric material that quantifies its inherent dissipation of electromagnetic energy to heat energy. The term refers to the tangent of the angle in a complex plane between the resistive (lossy) component of an electromagnetic field and its reactive (lossless) component. It is conveniently defined as the ratio of the imaginary permittivity of a material to its real permittivity value, i.e. tan $\delta = \varepsilon''/\varepsilon'$.

The terms "polymer" and "polymeric matrix" refer to both materials prepared from one monomer such as a homopolymer or to materials prepared from two or more monomers such as a copolymer, terpolymer, or the like. The term "copolymer" refers to a polymeric material prepared from at least two monomers.

The term "fluorocarbon-based" refers to a material that is fluorinated. Typically, the fluorocarbon-based materials of this disclosure are highly fluorinated.

The term "fluorinated" when used in conjunction with polymer, monomer, or group associated with a polymer or a monomer, refers to having at least one hydrogen atom replaced with a fluorine atom. The term "highly fluorinated" refers to polymers, monomers, or groups where many hydrogen atoms have been replaced with fluorine atoms, in some cases at least half of the hydrogen atoms have been replaced by fluorine atoms, and in other cases, nearly all of the hydrogen atoms have been replaced with fluorine atoms.

The term "(meth)acrylate" refers to both acrylate and methacrylate materials.

The term "epoxy" as used herein refers to reactive group that is three membered ring including two carbon atoms and an oxygen atom, commonly referred to as an "oxirane ring". The term "epoxy resin" as used herein is in agreement with the generally understood usage for this term in the art and is used to describe curable materials containing one or more epoxy groups.

The term "overlie" means to extend over so as to at least partially cover another layer or element. Overlying layers can be in direct or indirect contact (e.g., separated by one or more additional layers).

The above summary of the present disclosure is not intended to describe each disclosed embodiment or every implementation of the present disclosure. The description that follows more particularly exemplifies illustrative embodiments.

DETAILED DESCRIPTION

Figure 1A:
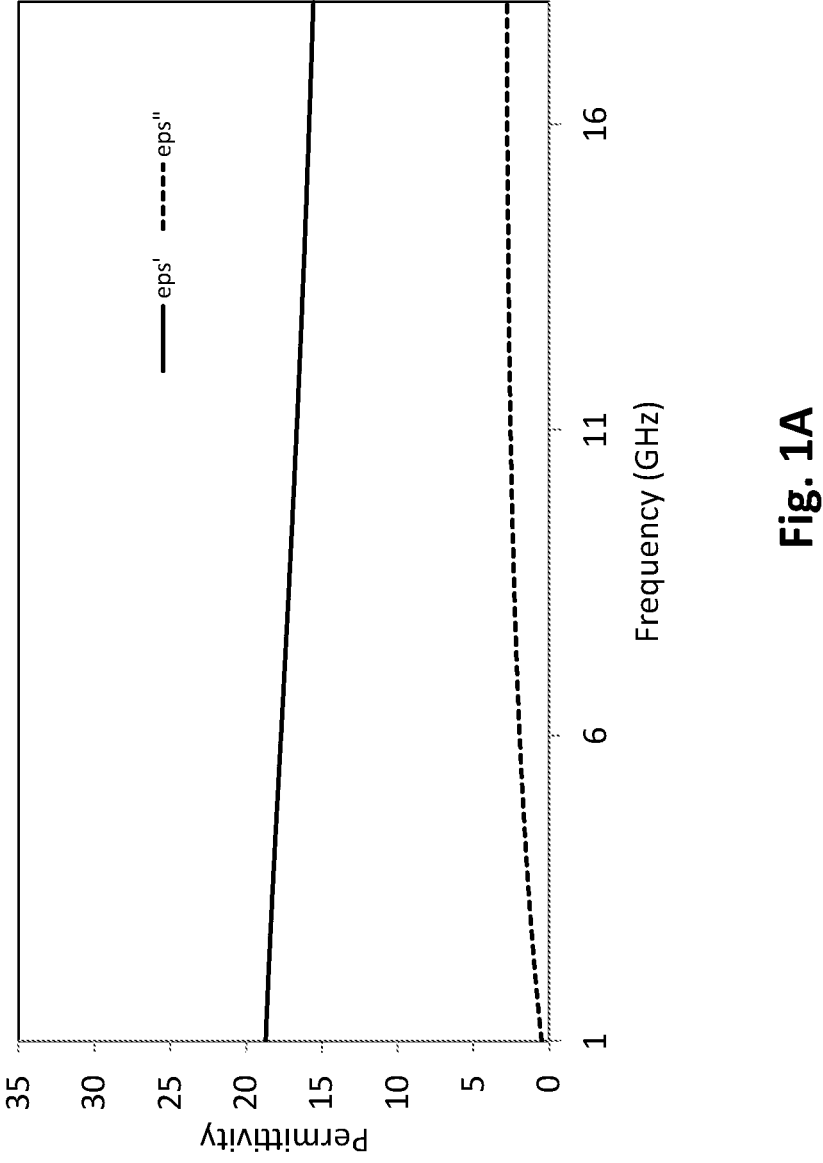
FIG. 1A shows the dielectric permittivity (eps'=real part and eps"=imaginary part) of the EM absorber/epoxy matrix composite in Example 1 as a function of frequency (1-18 GHz)

In the following description of illustrative embodiments, reference is made to the accompanying figures of the drawings which form a part hereof, and in which are shown, by way of illustration, specific embodiments. It is to be understood that other embodiments may be utilized and structural changes may be made without departing from the scope of the present invention.

In general, the present disclosure relates to a composite comprising a polymeric matrix and EM absorbers dispersed within the matrix. The EM absorbers each comprise a ceramic particle having a surface, and a magnetic coating on at least a portion of the surface of the ceramic particle. The magnetic coating adds magnetic loss (i.e. increases the value of the imaginary part of the magnetic permeability) to a nonmagnetic ceramic particle. The magnetic coating increases the real part of the permeability of the EM absorber to closely match, and in some embodiments match, the real part of the permittivity of the ceramic particle, thus reducing the reflective properties and enhancing the absorptive properties of the EM absorber and the resultant composite. The EM composites of the present disclosure are capable of mitigating electromagnetic interference in the 1-100 GHz frequency range, more particularly the 1-20 GHz frequency range.

Unlike prior composites where the magnetic component and ceramic component are separate particles dispersed within the matrix, the magnetic component in the present disclosure is coated onto the ceramic particle. This reduces the overall magnetic content in the composite and avoids or reduces depolarization effects that can reduce EM absorption. The lower magnetic content also translates into lower concentration of particulate matter in the matrix (e.g., number of EM absorbers vs. number of collective ceramic particles and magnetic particles) thus improving the mechanical properties of the resultant composite.

The components of the composite are described in further detail below.

EM Absorber

The EM absorber comprises a ceramic particle and a magnetic coating on a least a portion of the surface of the ceramic particle. The EM absorbers function as dielectric and magnetic absorbers in the 1-100 GHz frequency range.

The ceramic particle refers to a dielectric lossy ceramic particle that has a dielectric loss tangent in the range from 0.001-0.50, more particularly 0.01-0.30 over the frequency range of 1-100 GHz. The shape of the ceramic particle is not particularly limiting and may be provided in a variety of sizes, shapes and profiles, including for example, regular (e.g., symmetric) profiles such as spherical, and irregular (e.g., asymmetric) profiles. In some embodiments, the ceramic particles are spherical and have an average particle diameter that ranges from 0.1 μm to 50 μm and more preferably from 0.5 μm to 5 μm, as measure by light scattering analysis.

Ceramic particles may comprise a metal oxide, a metal nitride, a metal carbide, a metal sulfide, a metal silicide, a metal boride, a multiferroic compound, a mixed ceramic, or a chalcogenide glass.

Examples of suitable metal oxides include doped and undoped particles of tin oxide, iron oxide (ferrous or ferric oxide), zinc oxide, manganese oxide, lead oxide, nickel oxide, cobalt oxide, silver oxide, antimony oxide, copper(II) oxide, or silicon oxides (e.g., silicates). Mixtures of metal oxides are also suitable.

Examples of suitable metal nitrides include doped and undoped particles of tantalum nitride, titanium nitride, vanadium nitride, zirconium nitride. Mixtures of metal nitrides are also suitable.

Examples of metal carbides that are suitable include doped and undoped particles of tungsten carbide, niobium carbide, titanium carbide, vanadium carbide, molybdenum carbide, silicon carbide, zirconium carbide, boron carbide, and titanium silicon carbide. Mixtures of metal carbides are also suitable.

Examples of suitable metal sulfides include doped and undoped particles of copper sulfide, silver sulfide, iron sulfide, nickel sulfide, cobalt sulfide, lead sulfide, and zinc sulfide. Mixtures of metal sulfides are also suitable.

Examples of suitable metal silicides include doped and undoped particles of chromium silicide, molybdenum silicide, cobalt silicide, vanadium silicide, tungsten silicide, and titanium silicide. Mixtures of metal silicides are also suitable.

Examples of suitable metal borides include doped and undoped particles of chromium boride, molybdenum boride, titanium boride, zirconium boride, niobium boride, and tantalum boride. Mixtures of metal borides are also suitable.

Examples of suitable multiferroic compounds include $LuFe_2O_4$, $BiFeO_3$, $BiMnO_3$.

Examples of mixed ceramics include a mixture of metal or metalloid elements. Suitable examples include doped and undoped particles of silicon carbide and beryllium oxide, silicon carbide and aluminum nitride, copper(II) oxide and aluminum oxide, aluminum nitride and glassy carbon, and Si—Ti—C—N ceramics.

Examples of suitable chalcogenide glass particles include glassy materials based on As—Ge—Te and Se—Ge—Te.

Particularly suitable for use in the composites of this disclosure are metal oxides, especially copper(II) oxide, also referred to as cupric oxide. Suitable copper(II) oxide particles typically have an average particle size in the range of 50 nanometers to 50 micrometers, more typically 1 micrometer to 10 micrometers, as measured by light scattering analysis.

The EM absorber further comprises a magnetic coating on at least a portion of the surface of the ceramic particle. The magnetic coating may be applied to the ceramic particles by known techniques, such as the metal solvent plating technique disclosed in U.S. Pat. No. 3,549,412 (Frey, et al.) or the chemical vapor deposition (CVD) technique disclosed in U.S. Pat. No. 3,404,034 (Maurer, et al.). The magnetic coating may be continuous or discontinuous. In some embodiments, the magnetic coating completely encapsulates the ceramic particle.

An EM absorber is not limited to a single magnetic coating and may in some embodiments include at least two magnetic coatings, where each coating comprises the same or different magnetic material. The two or more magnetic coatings may cover different regions of the ceramic particle surface. In some embodiments, the magnetic coatings may at least partially overlap, such that at least a portion of one magnetic coating overlies at least a portion of one or more other magnetic coatings. In some preferred embodiments, a first magnetic coating encapsulates the ceramic particle and a second magnetic coating completely encapsulates the first magnetic coating, forming an EM absorber with core/shell/shell configuration. The thickness of each magnetic coating may be the same or different.

Suitable magnetic coatings may include, for example, a ferromagnetic or ferrimagnetic material. In some embodiments, the magnetic coating may comprise a metal, such as iron, cobalt or nickel; a metal alloy such as nickel-iron (Permalloy), iron-silicon-aluminum (Sendust) or iron-silicon-chromium (Iron-silicide); a ceramic ferrite; or a combination thereof.

In some preferred embodiments, the magnetic coating is iron metal.

The absorption frequency and bandwidth of the EM absorbers can be tailored by the selection of materials making up the ceramic particles and magnetic coatings, the size of the ceramic particles, the thicknesses (i.e. amount) of the magnetic coatings thereon; and/or the ratio of components of the magnetic coating to components of the ceramic particles.

The thickness of the magnetic coating is typically less than the smallest dimension of the ceramic particle. In some embodiments, the thickness ranges from 50 nanometers to 10 micrometers, more particularly 50 nanometers to 5 micrometers.

In a preferred embodiment, the ceramic particle is copper (II) oxide, the magnetic coating is iron metal, and the ratio of copper(II) oxide to iron metal in the EM absorber ranges from 1.1 to 32:1.

Although the magnetic coating may undergo surface oxidation in some instances, depending upon the nature of the magnetic coating, manufacturing process, and environmental conditions, in preferable embodiments, the oxidation does not extend into the bulk of the magnetic coating.

Polymeric Matrix

The polymeric matrix may comprise a chlorine-containing polymer, a fluorocarbon-based polymer, an epoxy-based polymer, a (meth)acrylate polymer, a polyether polymer, co-polymers of such, or a combination thereof.

Examples of suitable chlorine-containing polymers include polyvinyl chloride polymers (PVCs) and polyvinylidene chloride polymers (PVDC).

Examples of fluorocarbon-based polymers include vinylidene fluoride (VDF)-containing fluorocarbon-based polymers. Examples include the materials THV 200, THV 400, THV 500G commercially available from 3M Corp, St. Paul, Minn.; KYNAR 720, KYNAR 740, KYNAR 1000HD, and KYNAR ADX commercially available from ARKEMA, Philadelphia, Pa.; HYLAR 700 commercially available from Ausimont USA Inc., Morristown, N.J.; and FLUOREL FC-2178 commercially available from 3M Corp, St. Paul, Minn. Particularly useful are the poly-VDF polymers KYNAR 720, KYNAR 740, KYNAR 1000HD, and KYNAR ADX commercially available from ARKEMA, Philadelphia, Pa.

Other suitable fluorocarbon-based polymers include those copolymers prepared from the fluorocarbon-based monomers tetrafluoroethylene (TFE), hexafluoropropylene (HFP), and VDF. Examples of such polymers are described in U.S. Pat. No. 6,310,141 (Chen et al.). Examples of suitable fluorocarbon-based polymers include, for example, terpolymers of 20-60 wt. % TFE, 30-50 wt. % HFP, and 10-40% VDF. These terpolymers are commercially available from 3M Corp, St. Paul, Minn. under the trade name "THV". Additional examples include hexafluoropropylene-tetrafluoroethylene-ethylene (HTE) terpolymers, ethylene-tetrafluoroethylene (ETFE) copolymers, hexafluoropropylene-tetrafluoroethylene (FEP), and tetrafluoroethylene-perfluoro (alkoxy alkane) (PFA) copolymers. These copolymers are also available from 3M Corp, St. Paul, Minn.

Examples of suitable epoxy-based polymers include a wide range of epichlorohydrin-based polymers and curable epoxy resin-based polymers. Suitable epichlorohydrin-based polymers include poly-epichlorohydrin such as the epichlorohydrin homopolymer commercially available from Zeon Chemical as HYDRIN H (CO), epichlorohydrin copolymers such as the copolymer of epichlorohydrin and ethylene oxide commercially available from Zeon Chemical as HYDRIN C (ECO), and the terpolymer of epichlorohydrin, ethylene oxide, and allyl glycidyl ether commercially available from Zeon Chemical as HYDRIN T. Suitable curable epoxy resins include those based upon bisphenol-A, bisphenol-F, phenol novolacs, or combinations thereof. Examples of suitable epoxy resins based upon bisphenol-A include: EPON 828 (liquid epoxy resin) and EPON 1001F (solid epoxy resin), commercially available from Momentive Specialty Chemicals, Columbus, Ohio; DER 6508 (high molecular weight epoxy resin) commercially available from Dow Chemical Company, Midland Mich.; and EPDXICURE resin (a low molecular weight epoxy resin) commercially available from Buehler, Lake Bluff, Ill. An example of a suitable bisphenol-F epoxy resin is EPON 862 (a low molecular weight epoxy resin) commercially available from Momentive Specialty Chemicals, Columbus, Ohio. Examples of suitable epoxy resins based upon phenol novolacs include: EPON 1050, commercially available from Momentive Specialty Chemicals, Columbus, Ohio; and ARALDITE ECN 1299 commercially available from Huntsman Advanced Materials Americas, Inc., The Woodlands, Texas. Mixtures or epoxy resins can also be used. The epoxy resins can be cured using a wide variety of curing agents including amine-based curing agents, phenolic curing agents, and anhydride-based curing agents.

Examples of suitable (meth)acrylate polymers and copolymers include polymethyl acrylate polymers (PMA) and polymethyl methacrylate polymers (PMMA) which demonstrate a high degree of amorphous content, polar groups from the (meth)acrylate functionality, and generally show moderate dielectric loss at room temperature.

Examples of polyether polymers include polyethylene oxide and copolymers of such, and polypropylene oxide and copolymers of such.

For a variety of reasons, epoxy-based polymeric matrices and fluorocarbon-based polymeric matrices are particularly suitable polymeric matrix materials, more preferably epoxy-based polymeric matrices. These reasons include not only the desirable lossy properties of the polymeric matrices, but also stability over time, availability of materials, and handling properties.

Other suitable polymeric matrices may include a silicone, a cyclic olefin copolymer (COC), a low-density polyethylene (LDPE), a high-density polyethylene (HDPE), a polystyrene (PS), a polypropylene (PP), a polyphenylene sulfide (PPS), a polyimide (PI), a syndiotactic polystyrene (SPS), a polytetrafluoroethylene (PTFE), a butyl rubber, an acrylonitrile butadiene styrene (ABS), a polycarbonate (PC), a polyurethane, or a combination thereof. In some preferred embodiments, the polymeric matrix includes silicone.

Composite

The composites of the present disclosure generally mitigate electromagnetic interference in the frequency range from 1 GHz to 100 GHz, more particularly from 1 GHz to 20 GHz. However, it is possible to tune the frequency range, as well as the bandwidth and magnitude of electromagnetic absorption by adjusting the number, composition and/or physical parameters of the EM absorbers with the composite.

The composites of the present disclosure may comprise a single type of EM absorber. Alternatively, the composites of the present disclosure may comprise two or more different types of EM absorbers, wherein the two or more different types of EM absorbers comprise different ceramic particles (e.g., different compositions and/or sizes), different magnetic coatings (e.g., different compositions, different surface coverages, and/or different thicknesses), different ratio of components in the magnetic coatings to components in the ceramic particles, or a combination thereof.

For example, a composite may comprise a first type of EM absorber having a first ceramic particle and a first magnetic coating on at least a portion of the surface of the first ceramic particle. The composite may further comprise a second type of EM absorber having a second ceramic particle and a second magnetic coating on at least a portion of the surface of the second ceramic particle. In some embodiments, the first and second ceramic particles comprise the same material, and the material used to make the first magnetic coating is different from the material used to make the second magnetic coating. In another embodiment, the first and second ceramic particles are made from the same material, the first and second magnetic coatings are made from the same material, but the thicknesses of the first and second magnetic coatings are different. In yet another embodiment, the first and second ceramic particles are made from the same material, the first and second magnetic coatings are made from the same material, but the ratios of components in the magnetic coating to components in the ceramic particles are different.

Typically, the EM absorbers make up 10 to 90 wt %, more particularly 10 to 80 wt %, and even more particularly 60 to 85 wt % of the composite.

The EM absorbers within the composite typically have an average particle size of 0.1 micrometers to 50 micrometers, more particularly 0.1 micrometers to 10 micrometers, as determined by light scattering analysis.

A particularly suitable embodiment of composites of this disclosure include those where the polymeric matrix comprises epoxy-based resins including bisphenol-A epoxy resins, bisphenol-F epoxy resins, phenol novolac epoxy resins, or a combination thereof, and the EM absorbers comprise a copper(II) oxide particle with a coating of iron metal that at least partially covers the surface of the copper(II) oxide particle. In some embodiments, the coating of iron metal completely covers the surface of the copper oxide particle. The copper(II) oxide particles can be generally present in an amount of about 40 to about 95 wt %, about 50 to about 95 wt %, more typically about 70 to about 95 wt %. In some embodiments, the copper(II) oxide particles can be present in an amount, for example, greater than about 40 wt %, greater than about 50 wt %, greater than about 60 wt %, greater than about 70 wt %, greater than about 75 wt %, greater than about 80 wt %, greater than about 85 wt %, or greater than about 90 wt %.

The composites of the present disclosure can be made by first forming the EM absorbers by at least partially covering the surfaces of the ceramic particles with one or more magnetic coatings using, for example, the solvent plating technique disclosed in U.S. Pat. No. 3,549,412 (Frey, et al.), and dispersing the EM absorbers in the polymeric matrix.

Composites of the present application can be used to make electromagnetic interference shielding articles for used, for example, in high speed, high frequency (HSHF) electronics, include 5G phones, high speed data servers, interconnects, etc.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

The following abbreviations are used in this section: mL=milliliters, g=grams, cm=centimeters, mm=millimeters, $\mu$m=micrometers, mil=thousandths of an inch, wt %=percent by weight, min=minutes, and h=hours.

All materials are commercially available, for example, from Sigma-Aldrich Chemical Company, Milwaukee, WI, USA, or known to those skilled in the art, unless otherwise stated or apparent. Abbreviations for materials used in this section, as well as descriptions of the materials, are provided in Table 1.

TABLE 1

| Material | Details |
|---|---|
| CuO | Copper(II) Oxide (98%), powder, available from Sigma Aldrich |
| epoxy | Two-part epoxy, available under the trade designation 5 MINUTE EPOXY from ITW PERFORMANCE POLYMERS, Danvers, MA |
| iron pentacarbonyl | Pentacarbonyliron, 99.5%, available from Alfa Aesar, Haverhill, MA |
| n-octane | octane, anhydrous, ≥99%, available from Sigma Aldrich |
| heptane | n-Heptane, 99%, available from Alfa Aesar |

Characterization Methods
Magnetic Properties Test Method

The magnetic properties of the EM absorbers (powders) were tested at room temperature with a Lake Shore 7400 Series vibrating sample magnetometer (VSM) (Lake Shore Cryotronics, Inc., Westerville, OH, USA). The mass of the magnetic particles was measured (balance model MS105DU, Mettler Toledo, Switzerland) prior to the magnetic measurements. The mass of the empty VSM sample holder, similar to a Lake Shore Model 730935 (P/N 651-454), was used to zero the balance. For each sample, a new VSM holder was used. After the magnetic particles were loaded into the VSM sample holder (into the approximately 15 mm tap of the holder), the mass of powder was measured. To secure the powder in the tap of the holder, adhesive (3M SCOTCH-WELD Instant Adhesive ID No. 62-3801-0330-9, 3M Company, Maplewood, MN, USA) was applied. The adhesive dried for at least 4 hours prior to the measurement. The magnetic moment (emu) of the magnetic particles was measured at magnetic field H=18 kilooersted (kOe). The saturation magnetization MS per mass of the abrasive particles (emu/g) was calculated by dividing measured magnetic moment at 18 kOe to the mass of the magnetic particles. For magnetic powders, the measured coercive force Hc (Oe) and remanent magnetization Mr/MS was also recorded. These values were taken from the magnetization loops recorded by sweeping magnetic field H from +20 to −20 kOe. The sweeping speed of the magnetic field H for each measurement was 26.7 Oe/s.
Elemental Analysis Test Method The relative amount of iron to copper or silicon in the EM absorbers as measured with an Olympus Delta Professional handheld XRF analyzer from Olympus Corp., Japan. The samples were loaded into a 3 cm diameter sample cup with a 0.12 mil (0.003 mm) Mylar sample window such that the entire bottom of the sample window was covered with powder (about 5 mm deep). The weight percentage of the detected elements was determined from the "GeoChem" calibration of the instrument. The weight ratio of the elements of interest are presented in Table 2.
EMI Modeling One widely used and popular model, known as radar absorption or reflection loss model, assumes that electromagnetic wave is normally incident on a single layer composite absorber which is adhered to an electrically conducting metal plate (that prevents EM wave transmission), and then the EM wave absorbing performance can be evaluated in terms of the reflection loss (RL) in decibel (dB) units as a function of frequency. In this model, lower reflection loss indicates higher electromagnetic absorption performance. In this case, the EM wave absorption performances are investigated based on the following equations:

$$Z_{in} = Z_0 \sqrt{p_v / \in_z} \tan h \left\{ j(2\pi \mathrm{ft}/c) \sqrt{\mu_v \in_v} \right\} \tag{a}$$

$$RL = 20 \log \left[ \frac{(z_{in} - z_0)}{(z_{in} + z_0)} \right] \tag{b}$$

where $Z_0$ is the impedance of free space, t is the thickness of the absorber, and c is the speed of light. As indicated in Equation (a), the input impedance of an absorber depends on six parameters: the real and imaginary parts of complex permeability ($\mu_r = \mu' - j\mu''$) and complex permittivity ($\varepsilon_r = \varepsilon' - j\varepsilon''$) values, the thickness of an absorber (t), and the working frequency (f). Details of the model are described in the paper "Structural and high GHz frequency EMI (Electromagnetic Interference) properties of carbonyl iron and boron nitride hybrid composites"
Materials Research Express, 2019, 6 (10), 106305.

The microwave absorber performance of composites made with two different EM absorbers was carried out using the radar absorption model described above and composite thicknesses (t) of 1.5 mm and 2.0 mm. A lower composite thickness was chosen, since for many articles in real-world high frequency EMI applications, the thickness and dimensions are limited.

Example 1 (EX-1)

CuO (100 g) was charged into a glass fluidized bed CVD reactor with 45 mm inner diameter reactor (as described, for example, in Example 1 of U.S. Pat. No. 5,673,148 (Morris, et al)). The reactor was wrapped with electric heating tape and heated to 200° C. The temperature was monitored using a thermocouple in the fluidized bed. The bed of CuO was fluidized with a stream of 1.04 L/min nitrogen gas introduced into the reactor through the glass frit (i.e., from the bottom of the bed of CuO powder). Iron pentacarbonyl vapor was simultaneously introduced into the reactor, above the glass frit, in a stream of 600 cc/min nitrogen carrier gas by bubbling the carrier gas through iron pentacarbonyl in a chamber separate from the reactor. Additionally, the bottom of the bed was agitated with a PTFE coated magnetic stir bar rotating at 120 RPM. After 15.5 hours of total reaction time, the power to the electric heating tape and the nitrogen flow through the iron pentacarbonyl were turned off. The iron coated CuO powder was cooled under a flow of nitrogen through the glass frit to about 40° C. and collected to give 16 g of a reddish powder (EM absorber) that responded strongly to a permanent magnet. The remainder of the CuO powder and iron were clumped together in the bottom of the reactor.

The EM absorber was mixed with epoxy (Devcon 5-minute epoxy from ITW Devcon, Danvers, MA) in a small plastic jar to make an 80 wt % loaded composite and put in a speed mixer (DAC 150 FVZ, Siemens, spun at rpm=2000 for 2 mins.). The mix was cured at room temperature.

Once the epoxy composite was completely cured, the composite mix was taken out of the plastic jar (used as a mold). The composite sample was then machined into toroid or doughnut shaped sample (outer diameter=0.275 inch (0.70 cm) and inner diameter=0.120 inch (0.30 cm), thickness=1 mm) for electromagnetic co-axial measurements.

Complex dielectric and magnetic properties were calculated over the frequency range of 0.1 to 18 GHz from S parameters obtained using an Agilent E8363C Network Analyzer coupled with Model M07T from Damaskos Inc. air coaxial test fixture, using the doughnut shaped samples at room temperature. The scattering parameters of the test samples that correspond to the reflection (S11 and S22) and transmission (S21 and S12) of an EM wave were measured using the microwave vector network analyzer described above. The real and the imaginary components of the complex dielectric permittivity and magnetic permeability were determined from the complex scattering parameters using the well-known Baker-Jarvis model.

Figure 1B:
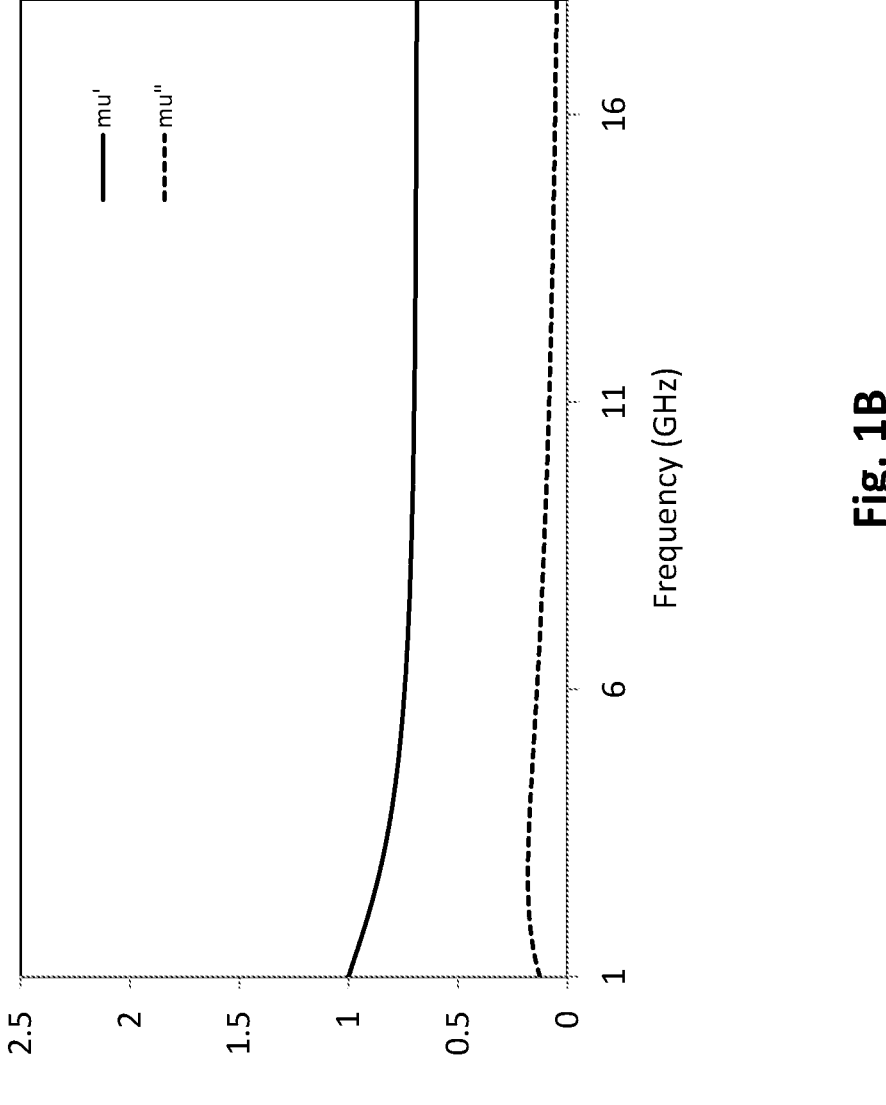
FIG. 1B shows the magnetic permeability (mu'=real part and mu"=imaginary part) of the EM absorber/epoxy matrix composite in Example 1 as a function of frequency (1-18 GHz)

FIGS. 1A and 1B below show the dielectric and magnetic characteristics of the Fe coated CuO EM absorber (80 wt. %)/epoxy matrix composites as a function of frequency (1-18 GHz). FIG. 1B shows the EM absorber demonstrates magnetic characteristics even though copper(II) oxide by itself is known to be paramagnetic. Thus, adding an iron coating on a purely dielectric ceramic such as copper(II) oxide adds functional magnetic property to a ceramic, even at high GHz frequencies.

Figure 1C:
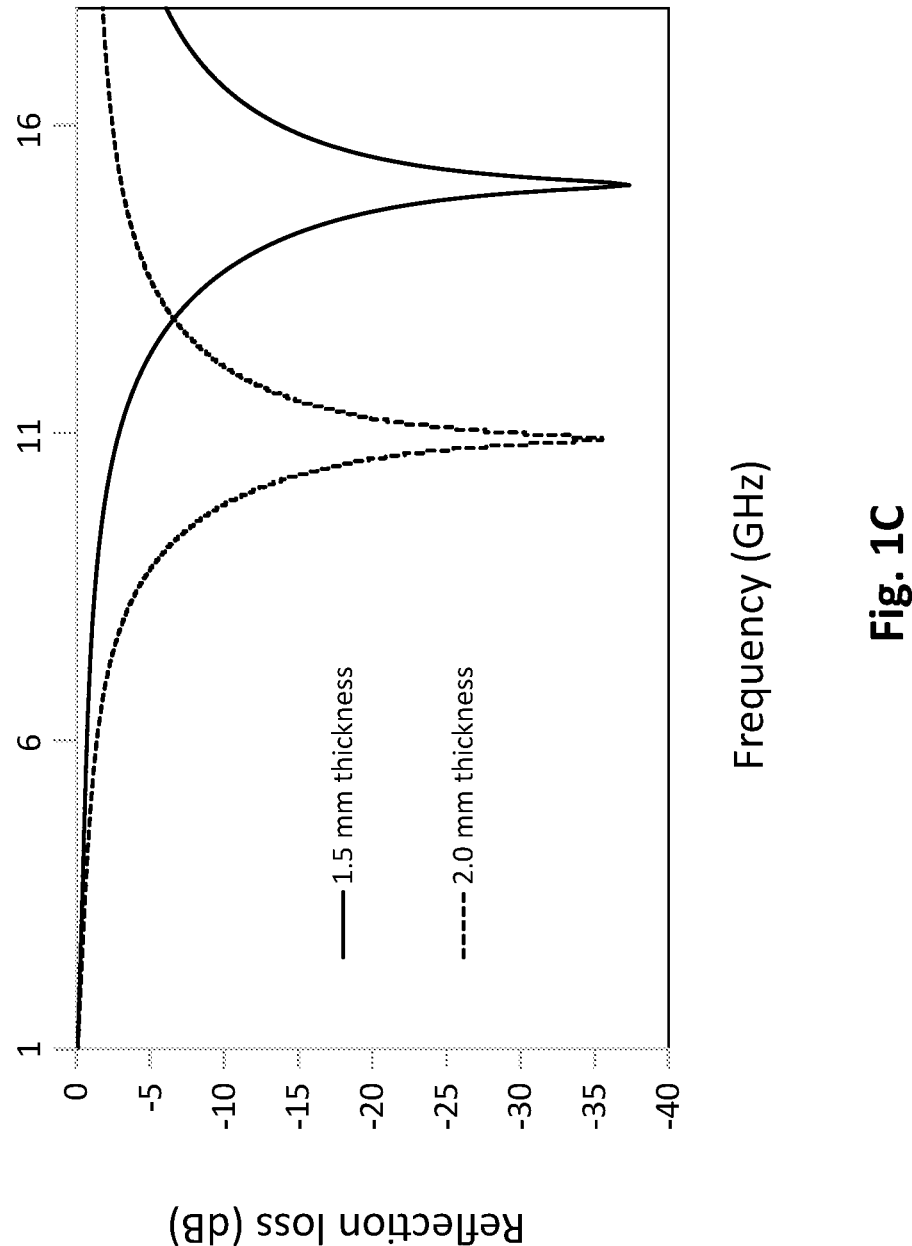
FIG. 1C shows the EM reflection loss of the EM absorber/epoxy matrix composite in Example 1 as a function of frequency for composite thickness (t) values of 1.5 mm and 2.0 mm.

FIG. 1C presents a comparison of the calculated reflection loss properties (RL in units of dB loss) of Fe coated CuO EM absorber (80 wt. % loading)/epoxy composites for thickness values of t=1.5 mm and 2.0 mm in the frequency range of 1-18 GHz at room temperature. At both thickness levels, the samples can attenuate incident electromagnetic waves. At a thickness of 1.5 mm, the sample show EM absorber performance with a minimum RL value (maximum absorber performance) of −37.3 dB at a frequency of 15.1 GHz, while at a thickness of 2.0 mm, the sample show EM absorber performance with a minimum RL value (maximum absorber performance) of −35.5 dB at a frequency of 11 GHz. Thus, for lower thickness values, the peak of EM absorption has shifted to higher frequency levels. Thus, the reflection loss of these composites exhibits effective bandwidth under −10 dB (i.e., >90% incoming EM power absorption), which is considered good absorber performance, at frequencies >10 GHz.

Example 2 (EX-2)

A 250 mL, two-neck Schlenk flask was charged with 25 g of CuO. Then about 100 mL of anhydrous n-octane was added via cannula transfer. Next, 60 mL of iron pentacarbonyl was added via plastic syringe. The flask was equipped with a reflux condenser and the reaction mixture was heated at reflux in a silicone oil bath. The mixture was stirred with a PTFE coated magnetic stir bar at 500 RPM under a nitrogen atmosphere. This was stirred for 18 hours and then removed from heat. The solid was collected by filtration and rinsed with heptane. The resulting dark gray powder was dried in the vacuum oven at 40° C. for 16 h giving an isolated yield of 42 g.

Figure 2A:
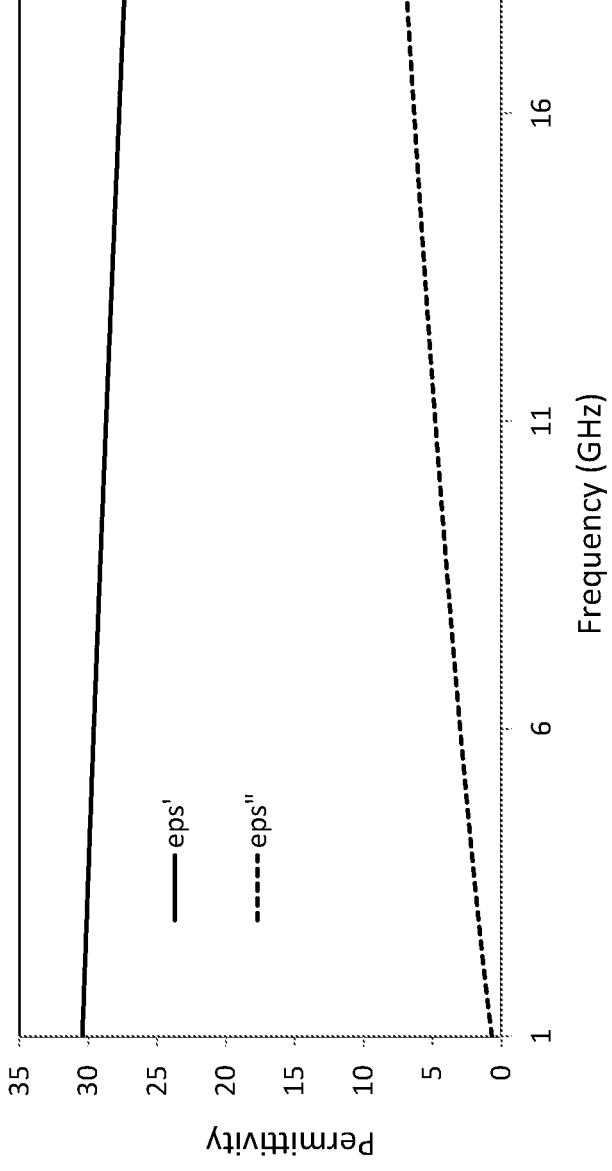
FIG. 2A shows the dielectric permittivity (eps'=real part and eps"=imaginary part) of the EM absorber/epoxy matrix composite in Example 2 as a function of frequency (1-18 GHz)
Figure 2B:
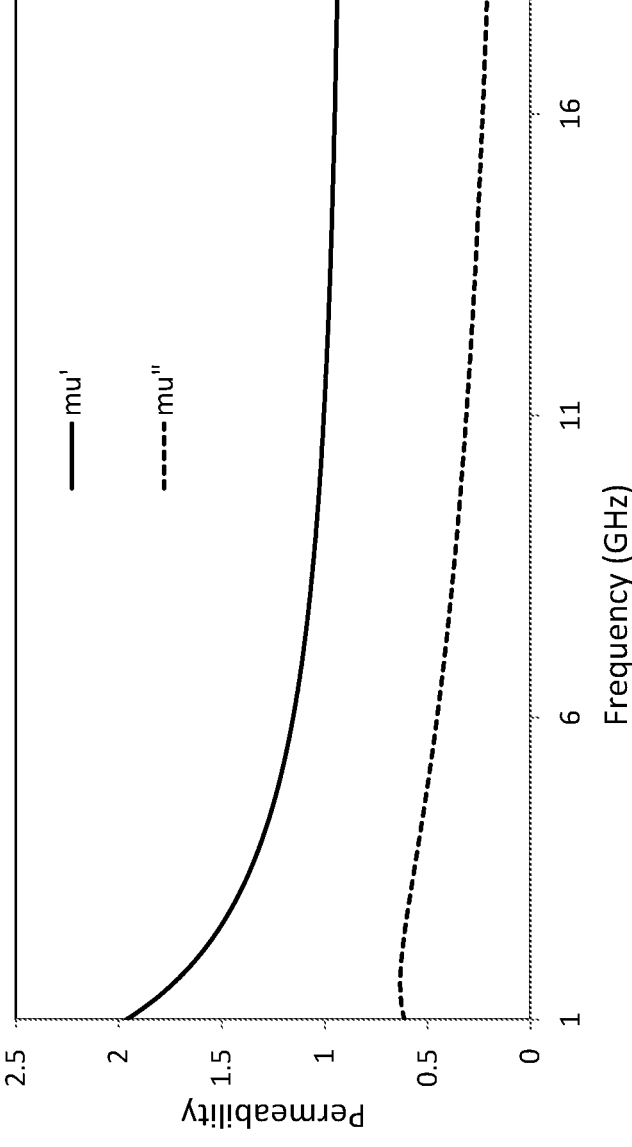
FIG. 2B shows the magnetic permeability (mu'=real part and mu"=imaginary part) of the EM absorber/epoxy matrix composite in Example 2 as a function of frequency (1-18 GHz)

Composite samples and test samples were made according to process described in Example 1. EM tests were done as described in detail earlier. The EM characteristics of the composites are plotted in FIGS. 2A and 2B.

Figure 2C:
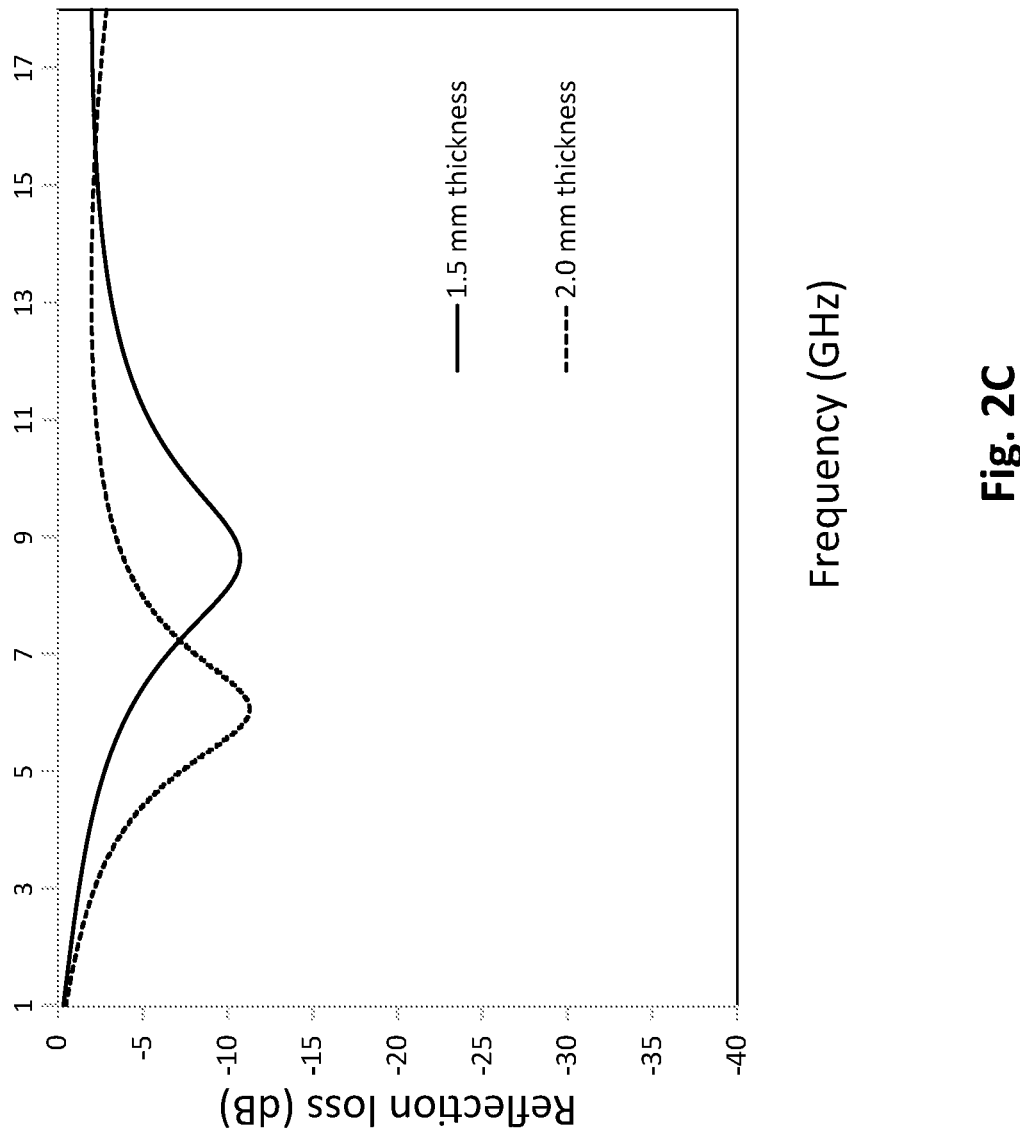
FIG. 2C shows the EM reflection loss of the EM absorber/epoxy matrix composite in Example 2 as a function of frequency for composite thickness (t) values of 1.5 mm and 2.0 mm.

FIG. 2C presents a comparison of the calculated reflection loss properties (RL in units of dB loss) of Fe coated CuO EM absorber (80 wt. % loading)/epoxy composites for thickness values of t=1.5 mm and 2.0 mm in the frequency range of 1-18 GHz room temperature. Once again, at both thickness levels, the samples can attenuate incident electromagnetic waves. At a thickness of 1.5 mm, the sample show EM absorber performance with a minimum RL value of −10.8 dB at a frequency of 8.65 GHz, while at a thickness of 2.0 mm, the sample show EM absorber performance with a minimum RL value of −11.3 dB at a frequency of 6 GHz. Thus, once again the reflection loss of these composites shows effective bandwidth under −10 dB (i.e., >90% incoming EM power absorption), which is considered good absorber performance, at frequencies >5 GHz.

Table 2. Vibrating sample magnetometry (VSM) measurements and elemental analysis by XRF for Examples 1 and 2.

TABLE 2

| Example | Magnetic Properties | | | Mass ratio, |
| | $M_S$, emu/g | $H_C$, Oe | $M_R/M_S$, % | Cu:Fe |
|---|---|---|---|---|
| EX-1 | 7.0 | 19.1 | 4.65 | 32.1 |
| EX-2 | 69.3 | 33 | 3.5 | 1.1 |

Thus, the present disclosure provides, among other things, a composite that mitigates electromagnetic interference in the frequency range of 1 GHz to 100 GHz. Various features and advantages of the present disclosure are set forth in the following claims.

What is claimed is:

1. A composite comprising:
   a polymeric matrix; and
   EM absorbers dispersed within the polymeric matrix, each EM absorber comprising a ceramic particle having a spherical surface and an average particle diameter ranging from 0.1 μm to 50 μm, and a magnetic coating on at least a portion of the spherical surface of the ceramic particle,
   wherein the ceramic particle comprises copper(II) oxide, a metal nitride, a metal carbide, a metal sulfide, a metal silicide, a metal boride, a multiferroic compound, or combinations thereof, and
   wherein the EM absorbers function as dielectric and magnetic absorbers in the 1-100 GHz frequency range.

2. The composite of claim 1, wherein the magnetic coating completely encapsulates the ceramic particle.

3. The composite of claim 1, wherein the magnetic coating comprises a ferromagnetic material or ferrimagnetic material.

4. The composite of claim 1, wherein the magnetic coating comprises a metal, a metal alloy, a ceramic ferrite, or a combination thereof.

5. The composite of claim 1, wherein the magnetic coating comprises iron metal.

6. The composite of claim 1, wherein the EM absorbers have an average particle size of 0.1 micrometers to 50 micrometers.

7. The composite of claim 1, wherein the EM absorbers make up 10 to 90 wt % of the composite.

8. The composite of claim 1, wherein the polymeric matrix comprises a silicone, a cyclic olefin copolymer (COC), a low-density polyethylene (LDPE), a high-density polyethylene (HDPE), a polystyrene (PS), a polypropylene (PP), a polyphenylene sulfide (PPS), a polyimide (PI), a syndiotactic polystyrene (SPS), a polytetrafluoroethylene (PTFE), a butyl rubber, an acrylonitrile butadiene styrene (ABS), a polycarbonate (PC), a polyurethane, or a combination thereof.

9. The composite of claim 1, wherein the polymeric matrix comprises a silicone.

10. The composite of claim 1, wherein one or more of the EM absorbers comprise a ceramic particle having at least two magnetic coatings thereon.

11. The composite of claim 10, wherein each of the at least two magnetic coatings thereon comprise a different magnetic material.

12. The composite of claim 10, wherein each of the at least two magnetic coatings thereon have different thicknesses.

13. The composite of claim 1, wherein the composite comprises two or more different types of EM absorbers, wherein the two or more different types of EM absorbers comprise different ceramic particles, different magnetic coatings, different ratio of components in the magnetic coatings to components in the ceramic particles, or a combination thereof.

14. The composite of claim 1, wherein the polymeric matrix comprises an epoxy-based polymer, the ceramic material is copper(II) oxide, and the magnetic coating is iron metal.

15. The composite of claim 14, wherein the mass ratio of copper(II) oxide to iron metal in the EM absorber ranges from 1:1 to 32:1.

16. The composite of claim 1, wherein the composite mitigates electromagnetic interference in the frequency range from 1 GHz to 100 GHz.

17. An electromagnetic interference shielding article comprising the composite of claim 1.

18. A method of making the composite of claim 1 comprising:

forming the EM absorbers by at least partially covering the spherical surfaces of each ceramic particle with the magnetic coating; and dispersing the EM absorbers in the polymeric matrix.

\* \* \* \* \*